(12) United States Patent
Chao et al.

(10) Patent No.: US 7,915,804 B2
(45) Date of Patent: Mar. 29, 2011

(54) ORGANIC ELECTRO-LUMINESCENT DISPLAY AND METHOD FOR FORMING THE SAME

(75) Inventors: Ching-Ian Chao, Hsinchu (TW);
Hsia-Tsai Hsiao, Hsinchu (TW);
Jiun-Haw Lee, Hsinchu (TW);
Mao-Kuo Wei, Hsinchu (TW);
Hoang-Yan Lin, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 355 days.

(21) Appl. No.: 11/869,781

(22) Filed: Oct. 10, 2007

(65) Prior Publication Data
US 2008/0258608 A1 Oct. 23, 2008

(30) Foreign Application Priority Data
Apr. 20, 2007 (TW) .............................. 96114022 A

(51) Int. Cl.
*H01L 51/00* (2006.01)
(52) U.S. Cl. ......................................... 313/504; 313/506
(58) Field of Classification Search .................. 313/504, 313/506; 359/463
See application file for complete search history.

(56) References Cited

U.S. PATENT DOCUMENTS

| | | | |
|---|---|---|---|
| 6,809,470 B2 | 10/2004 | Morley et al. | |
| 6,825,985 B2 | 11/2004 | Brown et al. | |
| 6,984,934 B2 | 1/2006 | Moller et al. | |
| 2003/0020399 A1 | 1/2003 | Moller et al. | |
| 2004/0201558 A1* | 10/2004 | Arnold et al. | 345/83 |
| 2004/0239236 A1* | 12/2004 | Morley et al. | 313/500 |
| 2006/0176245 A1* | 8/2006 | Sakai et al. | 345/53 |

FOREIGN PATENT DOCUMENTS
CN 1528021 9/2004
WO WO03007053 1/2003

OTHER PUBLICATIONS

CN Office Action mailed Jun. 27, 2008.
English Abstract of CN1528021.

* cited by examiner

*Primary Examiner* — Karabi Guharay
(74) *Attorney, Agent, or Firm* — Thomas | Kayden

(57) ABSTRACT

An organic electro-luminescence display comprises a substrate having a first and second surface, a plurality of microlens formed on the first surface, and a plurality of pixels with sub-pixels formed on the second surface. Particularly, the distance between the sub-pixels within any two adjacent pixels is substantially greater than that between the sub-pixels within the same pixel.

18 Claims, 7 Drawing Sheets

ORGANIC ELECTRO-LUMINESCENT DISPLAY AND METHOD FOR FORMING THE SAME

BACKGROUND OF THE INVENTION

1. Field of the Invention

The present invention relates to an organic electro-luminescent display and method for fabricating the same and, more particularly, to an organic electro-luminescent display with micro-lenses and method for fabricating the same.

2. Description of the Related Art

Recently, with the development and wide application of electronic products, such as mobile phones, PDA, and notebook computers, there has been increasing demand for flat display elements which consume less electric power and occupy less space. Among flat panel displays, organic light-emitting diodes (OLEDs) or namely organic electroluminescent devices are self-emitting, and highly luminous, with wider viewing angle, faster response, and a simple fabrication process, making them the industry display of choice.

In organic electroluminescence, electrons are injected from a cathode layer and holes from an anode layer, and the applied electric field induces a potential difference, such that the electrons and holes move and centralize in a thin light-emitting layer, resulting in recombination and light emission. Internal quantum efficiency of an OLED is the internal efficiency of converting electricity to light. After exciting the organic moleculars, a quarter of the excited electrons assume a singlet-state asymmetric spin configuration, releasing energy in the form of fluorescence. The other three-quarters assume triplet-state symmetric spin configuration, and release energy in the form of phosphorescence. The triplet state excited electrons also release energy in the form of phosphorescence in organometallic compounds. Therefore, OLED internal quantum efficiency depends on the excitation mechanism, and on the fluorescence or phosphorescence of luminescent material chosen. Currently, the higher internal quantum efficiency is to use the phosphorescent materials instead of fluorescent materials.

The external quantum efficiency of an OLED is the ratio of light output from the device to that from the organic layer inside the device. In a typical OLED, not all light from the organic layer can pass through the device, with more than 40% of OLED light lost to surface plasmon resonance. In addition, the organic material and the glass substrate have a higher refraction index than air, so some light is limited in the device due to total reflection, some scattering outward from the device side. Around 80% of light is dissipated in the device, making conventional OLED external quantum efficiency below 20%. If the unused device light can be recovered, the OLED external quantum efficiency improves.

U.S. publication application 2003/0020399 discloses an organic electro-luminescent display 10, referring to FIG. 1. The organic electro-luminescent display 10 has a substrate 20, and a plurality of organic electro-luminescent diodes 30 is formed on the inner side of the substrate 20 and a plurality of micro-lenses 40 is formed on the outer side of the substrate 20. The emission light of the organic electro-luminescent diodes 30 can be introduced to the surrounding (or namely environment) via the micro-lenses 40, thereby enhancing the external quantum efficiency of the organic electro-luminescent display 10. Referring to FIG. 2, the conventional organic electro-luminescent display with micro-lenses 40, however, results in problems of image blur.

Referring to FIG. 3a, an observer 50 receives the emission light from the sub-pixel 32 passing through the micro-lenses 40 and would misunderstand the sub-pixel 32 located on the location 33 via line of vision. Therefore, the observer 50 would overlap the emission light of the sub-pixels 32 and 34 in different pixels 60, resulting in problems of image blur, referring to FIG. 3b.

Accordingly, a new structure capable of improving the problems of image blur of organic electro-luminescent devices and enhancing the external quantum efficiency in organic electro-luminescent devices.

BRIEF SUMMARY OF THE INVENTION

An exemplary embodiment an organic electroluminescent display comprises a substrate with a first surface and a second surface; a plurality of micro-lenses formed on the first surface; and a plurality of pixel structures formed on the second surface of the substrate, wherein each pixel structure has a plurality of sub-pixels and the distance between the sub-pixels within any two adjacent pixels is substantially greater than that between the sub-pixels within the same pixel.

According to another embodiment of the present invention, an electro-optical device is provided. The electro-optical device comprises the above organic electro-luminescent display; and an electrical element connecting to the organic electro-luminescent display.

Methods for fabricating organic electroluminescent display are provided. An exemplary embodiment of a method for fabricating organic electroluminescent display comprises providing a substrate with a first surface and a second surface; forming a plurality of micro-lenses on the first surface of the substrate; and forming a plurality of pixel structures on the second surface of the substrate, wherein each pixel structure has a plurality of sub-pixels and the distance between the sub-pixels within any two adjacent pixels is substantially greater than that between the sub-pixels within the same pixel.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
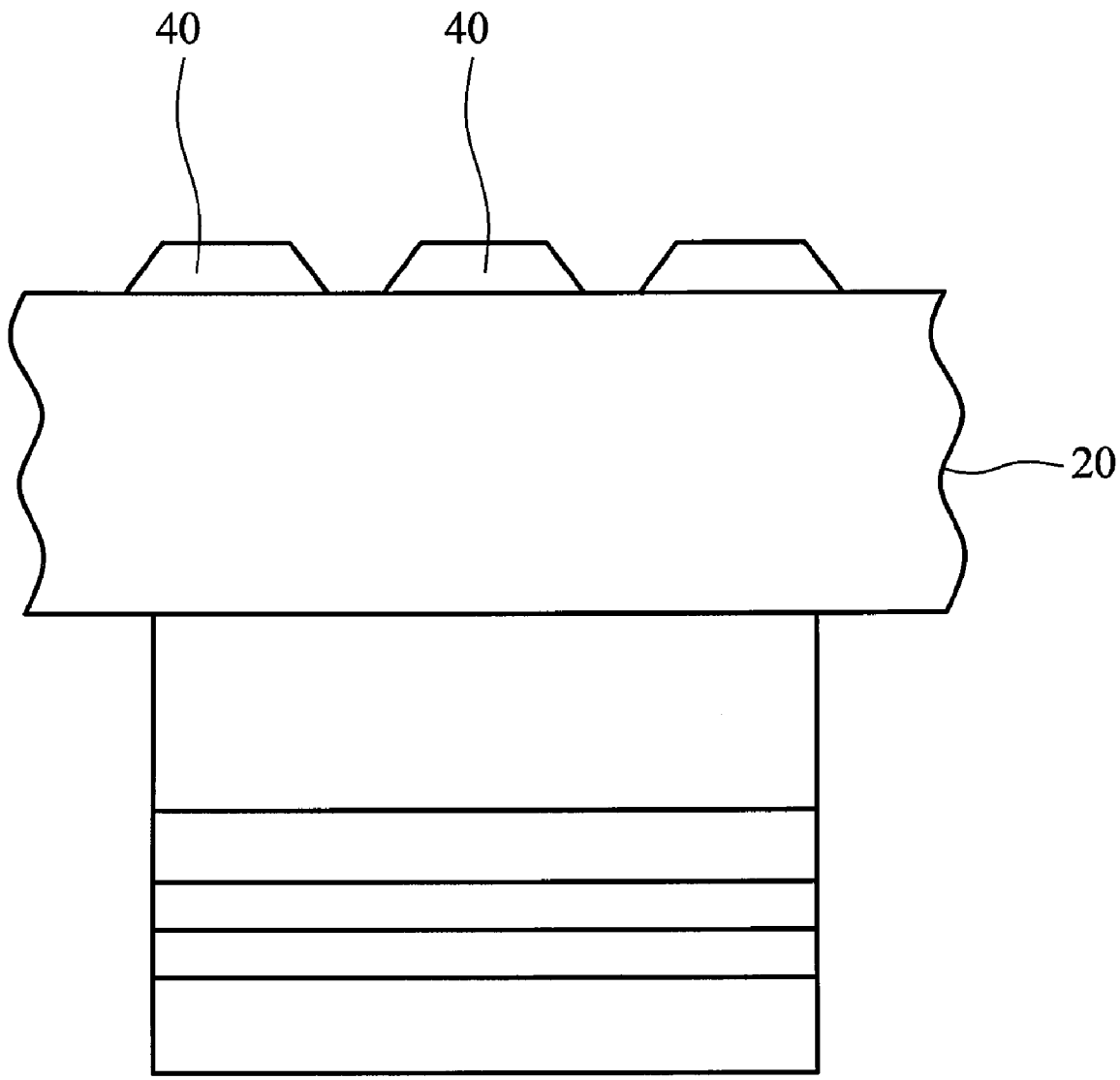
FIG. 1 is a cross-section of a conventional organic electro-luminescent display with micro-lenses.
Figure 2:
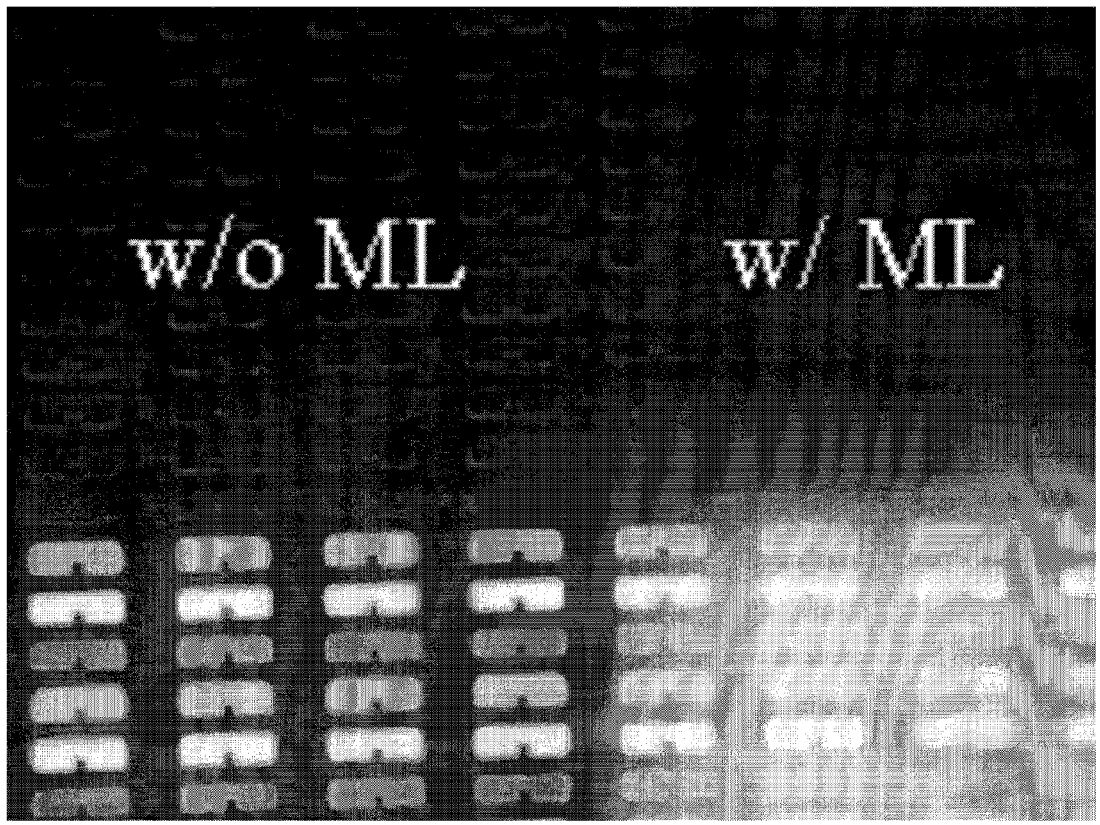
FIG. 2 is a photograph showing the image blur of the conventional organic electro-luminescent display with micro-lenses.
Figure 3A:
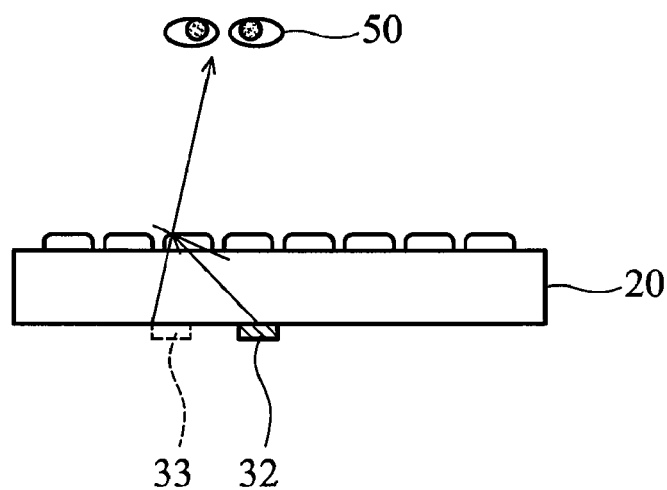
FIGS. 3a and 3b are schematic diagrams of conventional organic electro-luminescent display with micro-lenses, illustrating the occurrence of image blur.
Figure 3B:
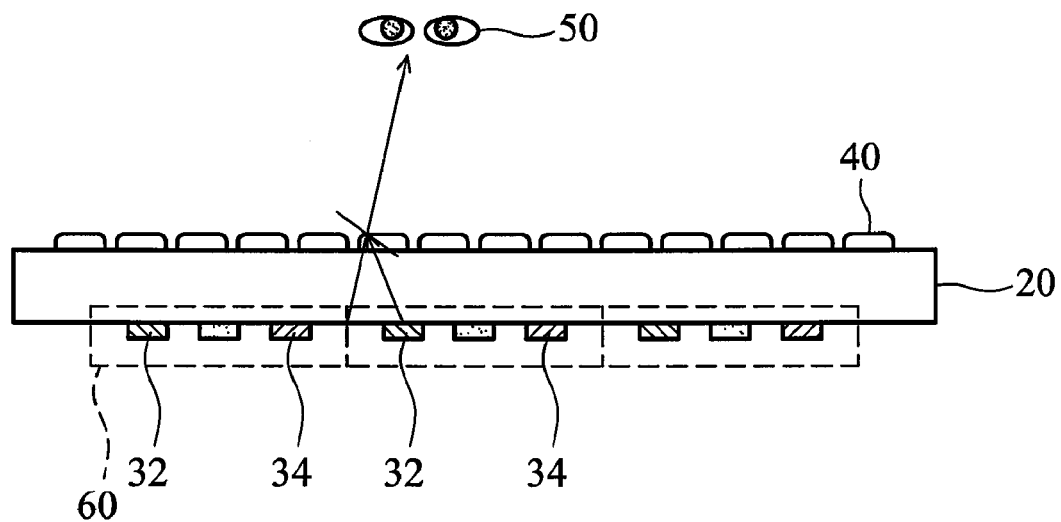
Figure 4A:
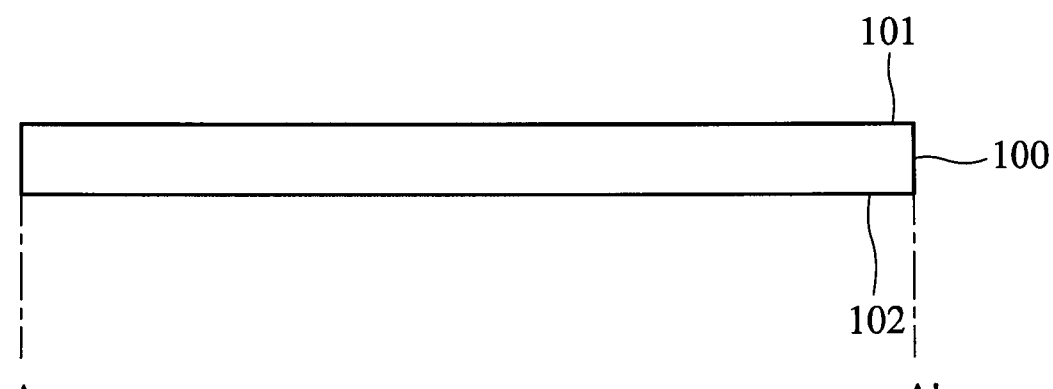
FIGS. 4a to 4c are cross sections of the process of manufacturing an organic electro-luminescent display according to an embodiment of the present invention.
Figure 4B:
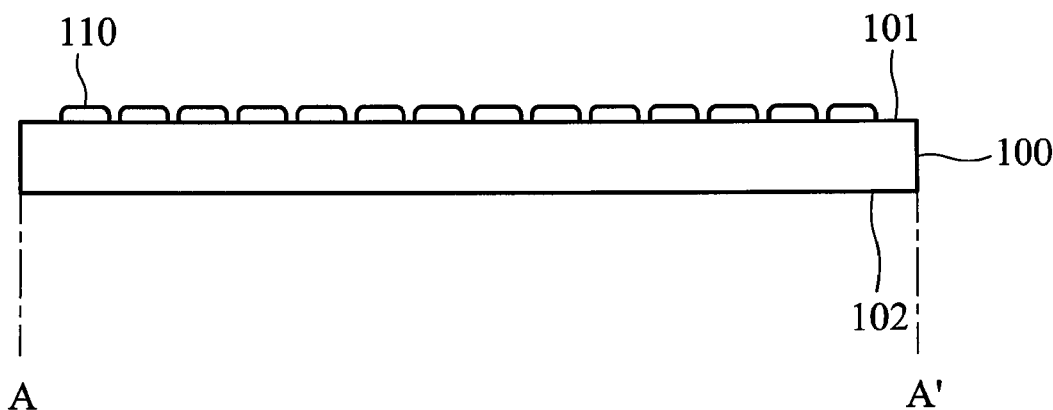
Figure 4C:
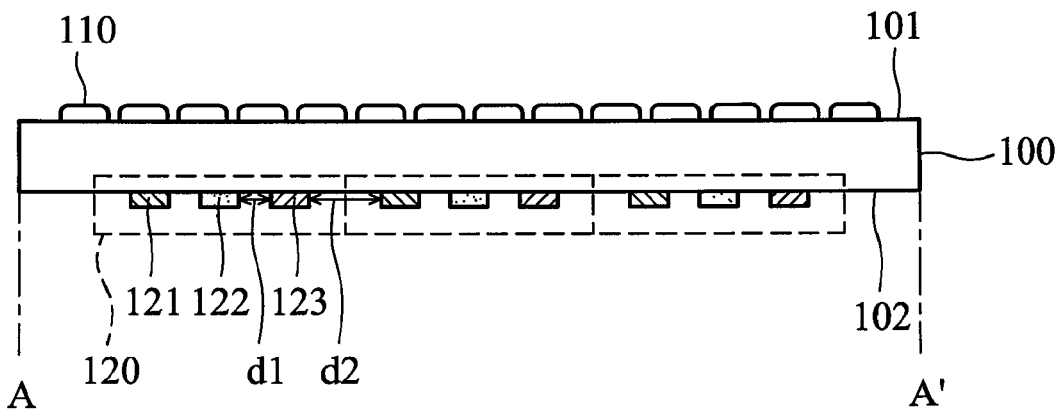
Figure 5:
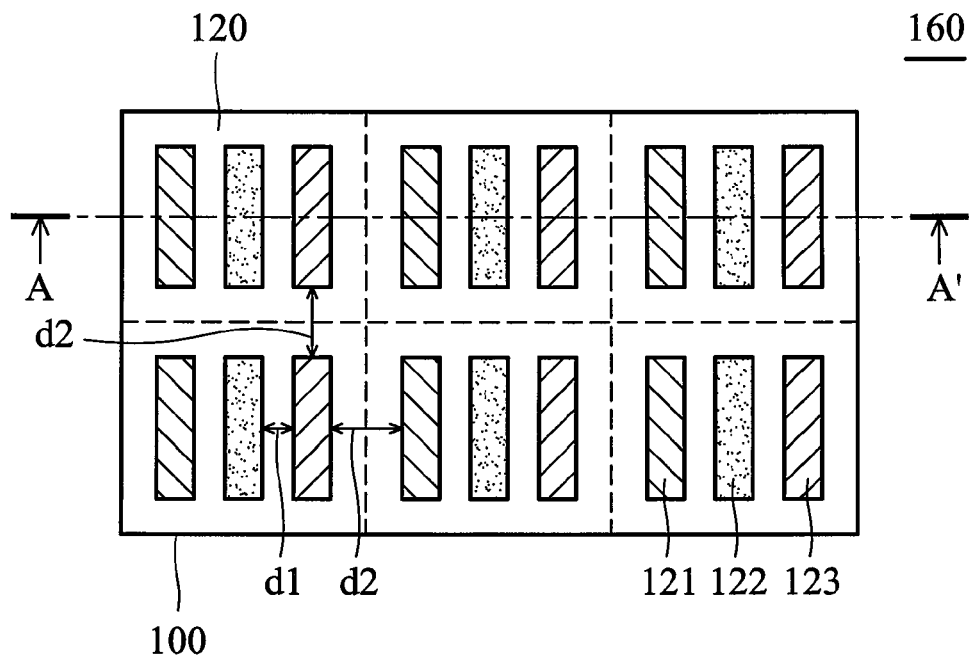
FIG. 5 is a schematic top view of FIG. 4c according to an embodiment of the present invention.

FIGS. 4a to 4c show the steps of a method for fabricating an organic electro-luminescent display according to an embodiment of the present invention. FIG. 5 is a top view of the embodiment of FIGS. 4a to 4c, and FIGS. 4a to 4c are sectional diagrams of FIG. 5 along line A-A'.

First, referring to FIG. 4a, a substrate 100 is provided, wherein the substrate 100 comprises a top surface 101 and a bottom surface 102. Herein, the substrate can be transparent substrate with active matrix elements for a full-color organic electro-luminescent display. The active matrix elements comprises thin film transistors (TFTs) array, such as amorphous-silicon TFT, poly-silicon TFT, microcrystalline silicon TFT, or combinations thereof. The substrate can comprise glass, quartz, plastics, or others.

Next, referring to FIG. 4b, a plurality of micro-lenses 110 are formed on the top surface 101 of the substrate 100. The micro-lenses are used to change the angle of emitting light, thereby enhancing the external quantum efficiency of the electro-luminescent device. For example, the micro-lenses 110 comprise a substantially cambered surface and bottom surface contacting the substrate 100, but not limited there it.

The micro-lens primarily changes the profile of air-substrate boundary, so that part larger-angle light can largely reduce the incident angle at air-micro-lens boundary without forming the total reflection. Hence, it can enhance the external emission efficiency of an OLED device. For example, the micro-lens 110 includes a bottom surface as a contacts with the substrate 100 and a light output surface, and the side-view profile of a light output surface, preferred, is a substantially curves surface, but not limited thereto. The side-view profile of a light output surface lets the light incident angle at the substantially curved surface is reduced and substantially less than or substantially equal to the critical angle, therefore the light will not total reflection, and will be by way of the refraction left the micro-lens so as to enhance the external emission efficiency of an OLED device. According to embodiment of the present invention, the top-view profile of the micro-lens 110 preferably defines a substantially circular or substantially polygonal shape (such as rectangle, square, pentagon, hexagon, or like as, or combinations thereof).

Figure 8:
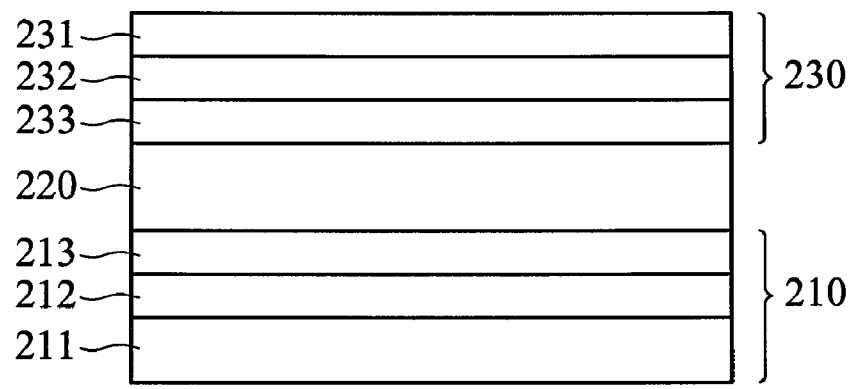
FIG. 8 is a schematic diagram of the organic electro-luminescent display with micro-lenses according to another embodiment of the present invention.

Next, referring to FIG. 4c, a plurality of pixel structures 120 are formed on the bottom surface 102 of the substrate 100. The pixel structures 120 comprise a plurality of sub-pixels. Herein, the pixel structures can comprise at least three or four sub-pixels. In an embodiment of the present invention, the pixel structures comprise three sub-pixels, such as red sub-pixel 121, blue sub-pixel 122, and green sub-pixel 123. Further, the pixel structures 120 can comprises four sub-pixels (such as WRGB, W means white, or other colors), five, six, and so on. In additional, the color of the sub-pixel can be used the color in the color coordinates, such as purple, orange, dark green, reddish orange, brown, or others. Specifically, each sub-pixel comprises an organic electro-luminescent element. The organic electro-luminescent element comprises small molecule, polymer, or combinations thereof. In the embodiment, the sub-pixel comprises small molecule organic electro-luminescent element 200 having a hole-related group 210, an emission layer 220 and an electron-related group 230, referring to FIG. 8.

The hole-related group 210 preferred comprises a anode 211, at least one hole injection layer 212, and at least one hole transport layer 213. The emission layer 220 formed on the hole-related group 210, comprising at least one light emitting layer. The electron-related group 230, formed on the emission layer 220, preferred comprises a cathode 231, at least one electron injection layer 232, and at least one electron transport layer 233. In additional, the hole-related group 210 and electron-related group 230 can be selectively formed on the emission layer 220 or below the emission layer 220 according the different embodiments base on different design rules. At least one of the cathode and the anode comprises a transparent conductive material, (such as ITO, IZO, AZO, HfO, CTO, ATO, ZnO, or others, or combinations thereof), reflective material (such as Al, Ag, Au, Cu, Fe, Sn, Ti, Ta, W, Mo, Rb, Li, Mg, Ca, Ni, alloy thereof, oxide thereof, or nitride thereof) or combinations thereof. Further, at least one of the cathode 211 and the anode 231 is formed on the substrate 100. The method for forming the cathode 211 and the anode 231 can be evaporation, sputtering, or PECVD. Moreover, a functional layer (such as electron blocking layer, electron catching layer, buffer layer, wavelength selection layer, filter layer, or wavelength translation layer) is employed by the organic electro-luminescent element, thereby enhancing the characteristics (such as brightness, CIE coordinates, or stability) thereof. The emission layer 220 can be polymer electroluminescent material and/ or small molecule electroluminescent material, and can be formed by thermal vacuum evaporation, roll-coating, ink-jet printing or spin on coating. The emitting layer can comprise one or multiple light-emitting material and dopants doped into the light-emitting materials, and the dopants comprises energy transfer types or carrier trapping types. Further, the dopants can be help to reduce the concentration quench effect and to obtain higher efficiency and higher brightness. In additional, at least one of the structure of the dopants and doped concentration of the dopants can be changed according to the type of the light-emitting material and/ or the characteristic of the organic electroluminescent device base on the design request for user. The light-emitting material can be fluorescent and/or phosphorescent, and the light-emitting material is a phosphorescent material as an example in the present invention, but not limited the material.

The method for achieving full-color emission of the organic electro-luminescent displays according to the present invention comprise direct at least three-color display techniques and one color (such as white or other color) with at least two complementary colors (via color filter, such as red, blue, green, or other color) display techniques. Further, the organic electro-luminescent display of the present invention can comprise a color changing layer which absorbs a master color (such as blue color) to transfer other colors (complementary colors of the master color, or other colors). Preferably, the color changing layer can be a color-filter emitting three complementary colors (such as red, green, blue, or other colors).

FIG. 5 shows a top-view of FIG. 4c, illustrating the structure of the organic electro-luminescent display 160. It should be noted that the pixel structure is designed in order to overcome the problems of image blur. Particularly, the distance d2 between the sub-pixels within any two adjacent pixels is substantially greater than the distance d1 between the sub-pixels within the same pixel. The distance d2 between the sub-pixels within any two adjacent pixels can be substantially equal to or substantially greater than 50 μm, preferred substantially equal to or substantially greater than 75 μm, more preferred substantially equal to or substantially greater than 100 μm. Further, the ratio between the distance d2 between the sub-pixels within any two adjacent pixels and the distance d1 between the sub-pixels within the same pixel is substantially equal to or substantially greater than 1.5, preferred substantially equal to or substantially greater than 1.75, more preferred substantially equal to or substantially greater than 2.

Figure 6:
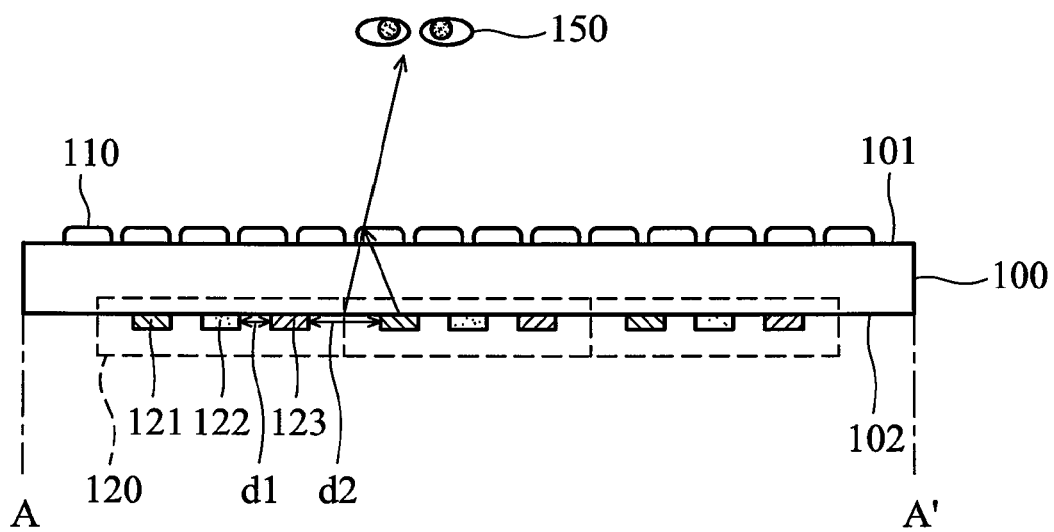
FIG. 6 is a schematic diagram of the organic electro-luminescent display with micro-lenses according to an embodiment of the present invention.

Referring to FIG. 6, an observer 150 receives the emission light from sub-pixel 121 via micro-lens 110 without overlapping other sub-pixels in the line of sight.

Figure 7A:
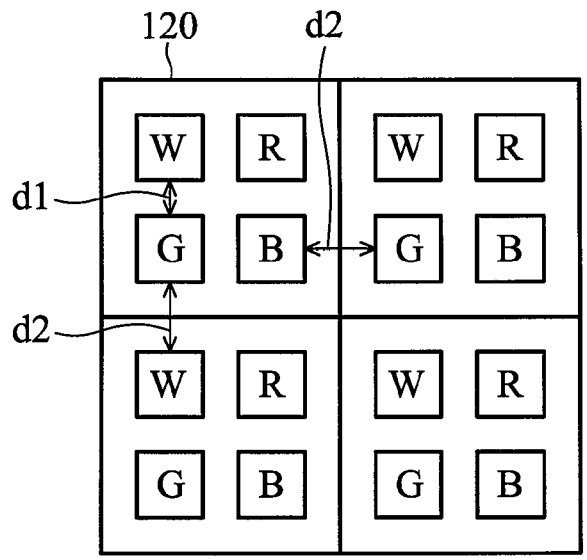
FIGS. 7a and 7b are schematic diagrams illustrating the pixel structures locations of the organic electro-luminescent display according to some embodiments of the present invention.
Figure 7B:
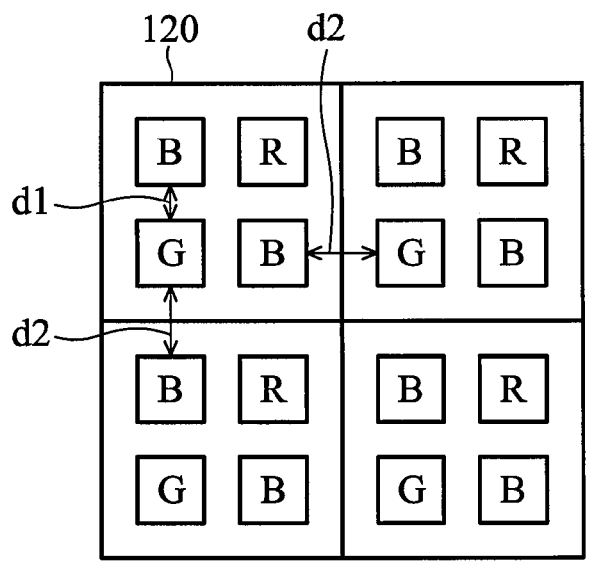

Referring to FIGS. 7a and 7b, the organic electro-luminescent display 160 of embodiments of the invention has a plurality of pixel structures. Each pixel structure comprises at least four sub-pixels such as red, green, blue, white, or combinations thereof. The pixel structure of the organic electro-luminescent display of FIG. 7a comprises red, green, blue, and white sub-pixels. The pixel structure of the organic electro-luminescent display of FIG. 7b comprises red, green, and two blue sub-pixels, thereby enhancing blue emission, but not limited it. The above sub-pixels comprise colors within chromaticity coordinates. Moreover, according to the embodiments of the present invention, each pixel can have five, six, seven, eight, and more sub-pixels.

In other embodiment, the previous red, green, blue sub-pixels can be achieved by using white-light OLED and color filter, and then the emission light level the color filter has color red, green, blue. It should be noted that the distance d2 between the sub-pixels within any two adjacent pixels is substantially greater than the distance d1 between the sub-pixels within the same pixel. Therefore, the problems of image blur would be improved, thereby enhancing the image sharpness of the organic electro-luminescent display.

Figure 9:
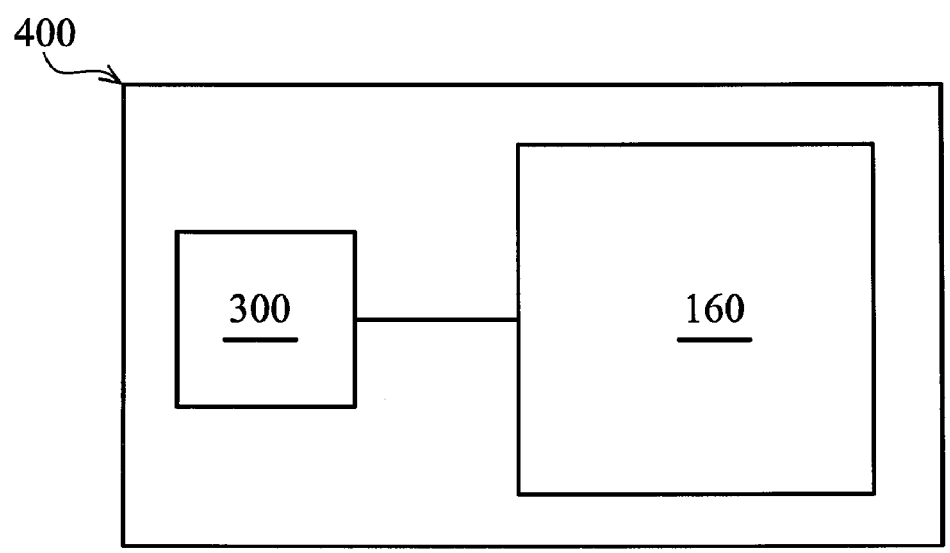
FIG. 9 schematically shows another embodiment of an electro-optical device for displaying images.

FIG. 9 schematically shows another embodiment of an electro-optical device 400. The electro-optical device 400 comprises the organic electro-luminescent display 160 electrically connected to an electrical device 300. The electrical device 300 comprises a control element, operation element, driving element, emitting element, protecting element, input element, memory element, sensor, detector, or element with other functions, or combinations thereof. The electro-optical device 400 can be a portable device (such as mobile phone, video camera, digital camera, personal digital assistant (PDA), notebook, music player, e-mail receiver-sender, global positioning system (GPS), watch, map-navigator, portable DVD player, or like as), a audio-voice device (such as audio-sound player, or like as), monitor, television, indoor/outdoor signboard, panel in the projector, or others.

While the present invention has been described by way of example and in terms of preferred embodiment, it is to be understood that the present invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic electro-luminescent display, comprising:
a substrate with a first surface and a second surface;
a plurality of micro-lens formed on the first surface; and
a plurality of pixel structures formed on the second surface of the substrate, each pixel structure has a plurality of sub-pixels, wherein the minimum distance between the sub-pixels within any two adjacent pixels is substantially greater than that between the sub-pixels within the same pixel, wherein a ratio between the minimum distance between the sub-pixels within any two adjacent pixels in the same row and the minimum distance between the sub-pixels within the same pixel in the same row is substantially equal to or substantially greater than 1.5.

2. The display of claim 1, wherein the distance between the sub-pixels within any two adjacent pixels is substantially equal to or substantially greater than 50 μm.

3. The display of claim 1, wherein the distance between the sub-pixels within any two adjacent pixels is substantially equal to or substantially greater than 100 μm.

4. The display of claim 1, wherein the ratio between the distance between the sub-pixels within any two adjacent pixels and the distance between the sub-pixels within the same pixel is substantially equal to or substantially greater than 2.

5. The display of claim 1, wherein the pixel structures comprises at least three sub-pixels.

6. The display of claim 1, wherein the pixel structures comprises at least four sub-pixels.

7. The display of claim 1, wherein the micro-lenses comprise a substantially cambered surface.

8. The display of claim 1, wherein a shape of the micro-lenses in a plane view comprises a substantially circular or substantially polygonal shape.

9. An electro-optical device, comprising:
an organic electro-luminescent display of claim 1; and
an electrical element connecting to the organic electro-luminescent display.

10. The display of claim 1, wherein a ratio between the distance between the sub-pixels within any two adjacent pixels in the same column and the distance between the sub-pixels within the same pixel in the same column is substantially equal to or substantially greater than 1.5.

11. A method for forming an organic electro-luminescent display, comprising:
providing a substrate with a first surface and a second surface;
forming a plurality of micro-lens on the first surface of the substrate; and
forming a plurality of pixel structures on the second surface of the substrate, each pixel structure has a plurality of sub-pixels, wherein the minimum distance between the sub-pixels within any two adjacent pixels is substantially greater than that between the sub-pixels within the same pixel, wherein a ratio between the minimum distance between the sub-pixels within any two adjacent pixels in the same row and the minimum distance between the sub-pixels within the same pixel in the same row is substantially equal to or substantially greater than 1.5.

12. The method of claim 11, wherein the distance between the sub-pixels within any two adjacent pixels is substantially equal to or substantially greater than 50 μm.

13. The method of claim 11, wherein the distance between the sub-pixels within any two adjacent pixels is substantially equal to or substantially greater than 100 μm.

14. The method of claim 11, wherein the ratio between the distance between the sub-pixels within any two adjacent pixels and the distance between the sub-pixels within the same pixel is substantially equal to or substantially greater than 2.

15. The method of claim 11, wherein the micro-lenses comprise a substantially cambered surface.

16. The method of claim 11, wherein a shape of the micro-lenses in a plane view comprises a substantially circular or substantially polygonal shape.

17. A method for forming an electro-optical device, incorporating the method for forming the organic electro-luminescent display of claim 11.

18. The method of claim 11, wherein a ratio between the distance between the sub-pixels within any two adjacent pixels in the same column and the distance between the sub-pixels within the same pixel in the same column is substantially equal to or substantially greater than 1.5.

* * * * *